(12) United States Patent
Marquardt et al.

(10) Patent No.: US 10,072,335 B2
(45) Date of Patent: Sep. 11, 2018

(54) METHOD OF COATING OF OBJECT

(71) Applicants: UNIVERSITY OF MARYLAND, COLLEGE PARK, College Park, MD (US); TRUSTEES OF THE WALTERS ART GALLERY, INC., Baltimore, MD (US)

(72) Inventors: Amy Elizabeth Marquardt, Washington, DC (US); Eric Breitung, Washington, DC (US); Raymond J. Phaneuf, College Park, MD (US); Glenn Gates, Baltimore, MD (US); Terry Weisser, Baltimore, MD (US)

(73) Assignees: University of Maryland, College Park, College Park, MD (US); Trustees of the Walters Art Gallery, Inc., Baltimore, MD (US)

( * ) Notice: Subject to any disclaimer, the term of this patent is extended or adjusted under 35 U.S.C. 154(b) by 0 days.

(21) Appl. No.: 14/839,664

(22) Filed: Aug. 28, 2015

(65) Prior Publication Data

US 2016/0060758 A1    Mar. 3, 2016

Related U.S. Application Data

(60) Provisional application No. 62/043,691, filed on Aug. 29, 2014.

(51) Int. Cl.
*C23C 16/34* (2006.01)
*C23C 16/455* (2006.01)
*C23C 16/40* (2006.01)

(52) U.S. Cl.
CPC ...... *C23C 16/45555* (2013.01); *C23C 16/402* (2013.01); *C23C 16/403* (2013.01);
(Continued)

(58) Field of Classification Search
CPC .... C23C 16/45525; C23C 16/34; C23C 16/40
See application file for complete search history.

(56) References Cited

U.S. PATENT DOCUMENTS 6,296,701 B1* 10/2001 Christen .............. C30B 23/02
117/101
7,560,395 B2* 7/2009 Ahn .................. H01L 21/28194
438/778
(Continued)

FOREIGN PATENT DOCUMENTS

JP          2005-23379       *   1/2005

OTHER PUBLICATIONS

Senzaki, Y., et al., "Atomic Layer Deposition of High-k Metal Oxides for Gate and Capacitor Dielectrics". The Electrochemical Society Meeting, Apr. 27-May 3, 2003 in Paris. Symposium K1: Advanced Short-Time Thermal Processing for Si-Based CMOS Devices, no page numbers.*
(Continued)

*Primary Examiner* — Bret P Chen
(74) *Attorney, Agent, or Firm* — Arent Fox LLP

(57) ABSTRACT

A method of coating a metallic object with a substantially invisible protective coating, wherein the coating comprises a first layer, a second layer, and a third layer, each layer comprising a metal oxide or a nitride. The method comprises placing the object in an atomic layer deposition (ALD) reactor; depositing a first layer comprising a metal oxide or a nitride on a surface of the object by ALD; depositing a second layer comprising a metal oxide or a nitride on the first layer by ALD; and depositing a third layer comprising a metal oxide or a nitride on the second layer by ALD, thereby forming the protective coating on the object.

18 Claims, 11 Drawing Sheets

(52) U.S. Cl.
CPC .......... *C23C 16/405* (2013.01); *C23C 16/407* (2013.01); *C23C 16/45553* (2013.01)

(56) References Cited

U.S. PATENT DOCUMENTS

| | | | | |
|---|---|---|---|---|
| 2003/0045082 A1* | 3/2003 | Eldridge | ........... | H01L 21/28273 438/593 |
| 2003/0064607 A1* | 4/2003 | Leu | ........... | C23C 16/02 438/780 |
| 2004/0203254 A1* | 10/2004 | Conley, Jr. | ........ | C23C 16/45527 438/778 |
| 2004/0208254 A1* | 10/2004 | Lee | ...... | H04L 1/0618 375/260 |
| 2006/0043504 A1* | 3/2006 | Ahn | ..... | C23C 16/0281 257/410 |
| 2006/0097299 A1* | 5/2006 | Ahn | ........ | H01L 28/60 257/295 |
| 2006/0141708 A1* | 6/2006 | Kim | ...... | H01L 21/28282 438/259 |
| 2006/0249081 A1* | 11/2006 | Schumacher | ....... | C23C 16/4411 118/726 |
| 2008/0119098 A1* | 5/2008 | Palley | ..... | C23C 16/305 442/64 |
| 2009/0309187 A1* | 12/2009 | Choi | ........ | H01L 27/10852 257/532 |
| 2011/0076513 A1* | 3/2011 | Tsai | ...... | C23C 14/221 428/697 |
| 2011/0217564 A1* | 9/2011 | Neogi | ...... | C23C 24/082 428/553 |
| 2014/0268490 A1* | 9/2014 | Tsai | ...... | H01G 4/01 361/305 |
| 2016/0008258 A1* | 1/2016 | Krause | ...... | A61Q 5/00 132/203 |

OTHER PUBLICATIONS

Andringa, A.-M., et al., "Low temperature plasma-assisted atomic layer deposition of silicon nitride moisture permeation barrier layers". 22nd International Symposium on Plasma Chemistry, Jul. 5-10, 2015; Antwerp, Belgium, O-20-6, pp. 1-3.*

Johnson, Richard W., et al., "A brief review of atomic layer deposition: from fundamentals to applications". Materials Today, vol. 17, No. 5, Jun. 2014, pp. 236-246.*

Hisamoto, Digh, et al., "FinFET—A Self-Aligned Double-Gate MOSFET Scalable to 20 nm". IEEE Transactions on Electron Devices, vol. 47, No. 12, Dec. 2000, pp. 2320-2325.*

Chua, Lay-Lay, et al., "General observation of n-type field-effect behavior in organic semiconductors". Nature, vol. 434, Mar. 10, 2005, pp. 194-199.*

Ramaiah, Kodigala Subba, et al., "Optical, structural and electrical properties of tin doped indium oxide thin films prepared by spray-pyrolysis technique". Semicond. Sci. Technol. 15 (2000) 676-683.*

* cited by examiner

METHOD OF COATING OF OBJECT

CLAIM OF PRIORITY UNDER 35 U.S.C. § 119(e)

The present application claims priority to Provisional Application No. 62/043,691 filed on Aug. 29, 2014, titled "PROTECTIVE COATINGS FOR CULTURAL HERITAGE OBJECTS," the entire contents of which are hereby expressly incorporated by reference herein.

STATEMENT OF GOVERNMENT SUPPORT UNDER 37 C.F.R. § 401.14(f)(4)

This invention was made with government support under DMR1041809 awarded by the National Science Foundation (NSF). The government has certain rights in the invention.

BACKGROUND OF THE INVENTION

Field of the Invention

Aspects in accordance with the present invention relate to protective coated objects and method of coating objects.

Background of the Technology

Cultural heritage objects, in particular silver artifacts, represent a significant component of the world's cultural heritage, retained in its museums for current and future generations. The beauty of silver, which has attracted artists and artisans through the ages, is threatened by silver's intrinsic chemistry, particularly formation of $Ag_2S$ from trace $H_2S$ in the atmosphere. A standard protective treatment, mechanical polishing and application of nitrocellulose lacquer, requires extensive manual labor to replace every 10-20 years, is difficult to apply uniformly, and damages the surface by removing small amounts of silver, leading to irreversible loss of important surface detail.

To reduce the tarnish rate, and thus the number of times a silver object must be polished, art conservators often apply a polymeric nitrocellulose lacquer film. The nitrocellulose coating is applied manually in a time- and labor-intensive method that can take 3-40 hours per object depending on the size and complexity. Manual application methods, such as brushing, dipping or spraying, create thinner areas or holes, even in films applied by a practiced art conservator. The inherent non-uniformity limits the effective coating lifetime, as thinner areas tarnish more quickly and produces a more visible coating. Additionally, cross-linking of the polymeric nitrocellulose causes the films to appear yellow, an effect that occurs within 1-2 years after the initial application. In a museum environment, nitrocellulose coatings have been documented to last 10-20 years before objects need to be polished and coated again. Given the time intensive process of applying the nitrocellulose coatings, museums with large silver collections (>5,000 objects) are in a never-ending cycle of coating and recoating silver objects.

The use of a single layer deposited by atomic layer deposition to produce protective coatings for silver and silver alloys is also known. For example, U.S. Pat. No. 8,883,258 to Makela et al. describes a single layer coating for silver. However, single layer techniques are not adequate because during the atomic layer deposition [ALD] process, defects occur in the film where poor-quality or no metal oxide is deposited (known in the art as "pinholes"). Though the number and size of pinholes in ALD films is low compared to other thin film coating methods, even a small number pinholes present a large problem because a small number of pinholes in a single layer can drastically reduce the effective lifetime of a barrier coating. Pinholes act as short circuits for diffusion allowing corrosive species to quickly reach the metal surface. Pinholes occurring in single layer films are unimpeded and can propagate through the film thickness, shortening the lifetime of the barrier film.

Therefore, there is a need in the art for an improved coating and coating method to protect cultural heritage objects from tarnishing while also being transparent in the visible light spectrum, in particular objects made of pure silver and/or silver alloys.

SUMMARY OF THE INVENTION

Aspects of the present invention include a protective coated object comprising an object having a surface and a coating on the surface. The coating may comprise a first layer comprising a metal oxide or a nitride; a second layer on the first layer, the second layer comprising a metal oxide or a nitride; and a third layer on the second layer, the third layer comprising a metal oxide or a nitride. The coating may be substantially transparent relative to the surface.

Aspects of the present invention also include a method of coating an object with a protective coating, comprising placing the object in an atomic layer deposition (ALD) reactor; depositing a first layer comprising a metal oxide or a nitride on a surface of the object by ALD; depositing a second layer comprising a metal oxide or a nitride on the first layer by ALD; and depositing a third layer comprising a metal oxide or a nitride on the second layer by ALD, thereby forming the protective coating on the object. The coating may be substantially transparent relative to the surface.

Additional advantages and novel features of aspects of the present invention will be set forth in part in the description that follows, and in part will become more apparent to those skilled in the art upon examination of the following or upon learning by practice thereof.

DETAILED DESCRIPTION

Figure 1:
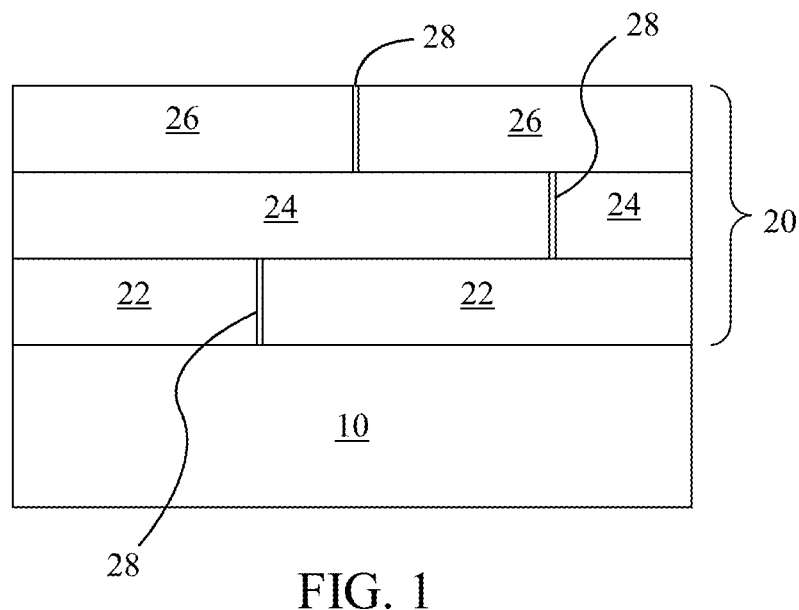
FIG. 1 illustrates an example coated object with discrete layers in accordance with aspects of the present invention.

FIG. 1 shows a first example embodiment of an object 10 having a protective coating 20. As shown in FIG. 1, the protective coating 20 may include a plurality of layers, 22, 24, 26. While three layers are illustrated in FIG. 1, more layers may be included, for example, 4, 5, and up to 50 layers. The layers may be deposited by atomic layer deposition (ALD), which is discussed in more detail below. FIG. 1 also shows a plurality of pinholes 28. Pinholes 28 are pathways that often occur during the ALD process when poor-quality or no metal oxide is deposited. While it is desirable for there to be no pinholes, pinholes are expected to occasionally occur during deposition. In a conventional single layer coating, the formation of a pinhole provides a direct pathway for a corrosive gas species to reach the surface of the object. As seen in FIG. 1, however, when multiple layers (e.g., three layers) are deposited, even if pinholes 28 are formed in each layer, the pinholes 28 are likely to be misaligned with each other. When the pinholes 28 are misaligned, the path for the corrosive species to reach the surface of the object 10 is much more difficult because there is no direct path. More layers increase the difficulty of the corrosive species reaching the surface of the object. Thus, the coating having multiple layers allows the coating to function as a barrier to protect the object from corrosion and tarnishing.

In an aspect of the present invention, the object being coated may be any cultural heritage object known to tarnish, oxidize, or otherwise deteriorate over time when exposed to the atmosphere. Examples include objects that comprise or consist of metals, stones, polymers, papers, parchments, glass, minerals, ceramics, and textiles. Example metal objects may comprise or consist of any one of titanium, chromium, manganese, iron, cobalt, nickel, copper, zinc, aluminum, molybdenum, palladium, silver, tungsten, platinum, gold, lead, alloys thereof, and combinations thereof. Example stone objects may comprise or consist of any one of marble, granite, slate, limestone, and combinations thereof. Example polymer objects may comprise or consist of any one of polycarbonate, polyvinylchloride, polyacrylates, polyurethanes, polyesters, nitrocelluloses, cellulose acetates, polyamides, polymethylmethacrylate, polypropylene, and polystyrene, and combinations thereof. Example paper objects may comprise or consist of any one of cellulose based, rag, filled, and calendared papers, and combinations thereof. In particular, the surfaces of the objects being coated may comprise or consist of the above noted materials. In an aspect of the invention, the object (more particularly, the surface of the object) comprises or consists of silver, more preferably a silver alloy. For example, the silver alloy may be silver alloyed with copper, lead, and/or zinc, e.g., sterling silver. The composition of the silver alloy, by weight, may be 85% to 99% silver and 1% to 15% copper, more preferably, 89% to 95% silver and 5% to 11% copper, and more preferably 92% to 94% silver and 6% to 8% copper. One example sterling silver composition is 89% by weight silver and 11% by weight copper. Another example sterling silver composition is 92.5% by weight silver and 7.5 by weight copper.

In an aspect of the present invention each of layers 22, 24, and 26 may comprise or consist of a metal oxide or a metal nitride material. For example each of layers 22, 24, and 26 may comprise or consist of any one of $Al_2O_3$, FeO, $HfO_2$, MgO, $SiO_2$, $SnO_2$, Ta, $Ta_2O_5$, TiN, $TiO_2$, $VO_2$, ZnO, and ZrO. In one example aspect, each layer has a different composition from all other layers. For example, layer 22 may comprise or consist of $Al_2O_3$, layer 24 may comprise or consist of TiO, and layer 26 may comprise or consist of ZnO. In another example aspect, layer 22 and layer 26 may have the same composition while middle layer 24 has a different composition. For example, layer 22 and layer 26 may both comprise or consist of $Al_2O_3$, while layer 46 may comprise or consist of ZnO or $TiO_2$.

As noted above, while three layers are illustrated in the example shown in FIG. 1, many more layers may be included depending on the object being coated. In one example aspect, four, five, or six layers may be present. Additional layers up to about 50 layers may present. The number of layers and the composition of the layers may be optimized for the particular object being coated. In an example aspect, the composition of layers may alternative between two compositions, such as where the first, third, fifth, and onward (i.e., all odd numbered layers) have a first composition while the second, fourth, sixth, and onward (i.e., all even numbered layers) have a second composition. For example, all odd numbered layers may comprise or consist of $Al_2O_3$ and all even numbered layers may comprise or consist of ZnO or $TiO_2$.

While the multiple layering described above provides the protective benefit, the thickness of the layers also impacts the degree of protection, and more particularly impacts the relative transparency of the coating. In an aspect of the present invention the thickness of each layer, the materials chosen, the order of the layers, and the overall total thickness of the coating (i.e., the total thickness of all layers together) may be selected such that the coating provides sufficient protection against corrosive species while also being substantially transparent in the visible light spectrum. Having a substantially transparent coating is an important factor in the context of coating cultural heritage objects because it is highly desirable that the objects retain their pre-coated/natural appearance. As used herein, substantially transparent means that the object appears to have the same color to the naked eye after being coated as compare to before being coated. A quantitative test, discussed below in an example, is the measurement of Delta $E_{2000}$ using the International Commission on Illumination (CIE) color-difference formula, CIEDE2000. Using this test, substantially transparent means a Delta $E_{2000}$ of 5 or less, more preferably 4 or less, more preferably 3 or less, more preferably 2 or less, more preferably 1.

In an aspect of the present invention, each layer may have a thickness between about 1-200 nm, more preferably about 2-100 nm, more preferably, about 3-50 nm. The total thickness of coating (i.e., the total thickness of all the layers together) may be about 50 to about 500 nm, more preferably about 75 to about 300 nm, more preferably about 100 nm to about 200 nm. In an aspect of the invention, all of the layers of the coating may have equal thickness. In another aspect, the layers may have different thickness. In one aspect, the coating may be configured such that each subsequent layer farther from the object surface has a smaller thickness than the layer before it. For example, in the three-layer example coating of FIG. 1, first layer 22 may be thicker than second layer 24, and second layer 24 may be thicker than third layer 26. In one example aspect, the third layer 26 may be several times thinner than the first and second layers 22, 24. For example, the ratio of thickness of the first layer 22 to the second layer 24 may be about 1.1:1 to 1.3:1, while the ratio of the first layer 25 to the third layer 25 may be about 4:1 to about 10:1. When a fourth layer is included on the third layer, the fourth layer may be slightly thinner than the third layer, such that the ratio of the third layer to the fourth layer may be about 1.1:1 to 1.3:1. In an example aspect, the first layer closest (e.g., directly contacting) to the object being coated may have a thickness of about 30 to about 60 nm, more preferably about 40 to about 50 nm, the second layer on the first layer may have the same range of thickness (while also satisfying the ratio noted above), and the third layer on the second layer may have a thickness of about 1 nm to 15 nm, more preferably about 3 nm to about 10 nm, and more preferably about 5 nm to about 8 nm. When a fourth layer is present on the third layer it may have similar range of thickness as the third layer (while also satisfying the ratio noted above).

FIG. 1, as discussed above, illustrates an example embodiment with discrete layering, where each of layers 22, 24, and 26 do not mix with the adjacent layers. In other words first layer 22 having a first composition may rest entirely beneath second layer 24 having a second composition. For example, layer 22 may comprise or consist of $Al_2O_3$ and layer 24 may comprise or consist of ZnO or $TiO_2$, where there is substantially no mixing of the layers, e.g., only a few particles of one layer may reside in another layer. As discussed below in more detail with respect to the ALD process, this is achieved by depositing the first layer of the first composition and then flushing the reactor chamber with nitrogen before depositing the second layer of the second distinct composition.

Figure 2:
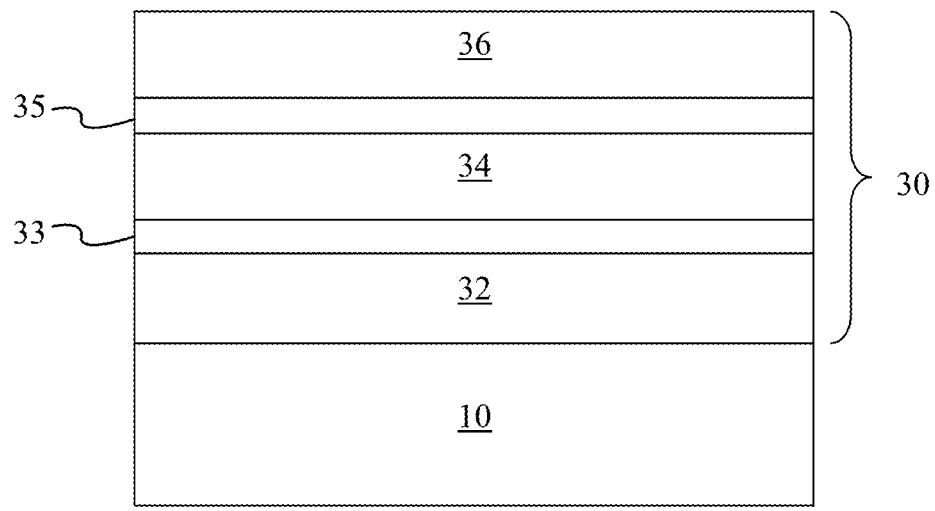
FIG. 2 illustrates an example coated object with gradient layers in accordance with aspects of the present invention.

FIG. 2 illustrates another example aspect having gradient layers between the main layers. As shown in FIG. 2, the object 10 may have a protective coating 30. The protective coating may include three primary layers 32, 34, 36 that may be the same as discussed above with respect to layers 22, 24, 26. That is, the compositions and thicknesses of the layers 32, 34, and 36 may be the same as layers 22, 24, 26. As further shown in FIG. 2, the coating 30 may additionally include a first gradient layer 33 and a second gradient layer 35. Each gradient layer may comprise or consist of a combination of materials from the two layers it is sandwiched between. That is, the first gradient layer 33 may comprise or consist of a mixture of components that form layer 32 and layer 34. Similarly, the second gradient layer 35 may comprise or consist of a mixture of components that form layer 34 and layer 36. Thus, each of the gradient layers 33, 35 may comprise or consist of a mixture of two or more of $Al_2O_3$, FeO, $HfO_2$, MgO, $SiO_2$, $SnO_2$, Ta, $Ta_2O_5$, TiN, $TiO_2$, $VO_2$, ZnO, and ZrO. For example, when the composition of first primary layer 32 and third primary layer 36 is $Al_2O_3$ and the composition of second primary layer 34 is ZnO, then the composition of the first and second gradient layers 33, 35 are each a mixture of $Al_2O_3$ and ZnO. When preparing the gradient layers, the deposition process may occur by gradually increasing the number of pulse of one composition while gradually decreasing the number of pulses of the other composition. The method of preparing the gradient layers is described in more detail below. For example, when the composition of the first primary layer 32 and the third primary layer 36 is $Al_2O_3$ and the composition of second primary layer 34 is ZnO, then the composition of the first gradient layer 33 would gradually increase in the amount of ZnO while gradually decreasing in the amount of $Al_2O_3$ in a direction away from the surface of the object. Similarly, the second gradient layer 35 would gradually increase in amount of $Al_2O_3$ and gradually decrease in the amount of ZnO in a direction away from the surface of the object.

In an aspect of the present invention, the gradient layers 33, 35 may each have a thickness of about 0.1 to 5 nm, more preferably about 0.3 to 3 nm, and more preferably 0.5 to 2 nm. As noted above, the relative thicknesses and thickness ratios of layers 32, 34, 36 discussed above with respect to layers 22, 24, 26 are applicable to the coating 30. Additionally, the ratio of thickness of the layer 32 to the thickness of the first gradient layer 33 and second gradient layer 35 may be about 15:1, more preferably 12:1, and more preferably 10:1. The ratio of the thickness of the layer 34 to the first gradient layer 33 and the second gradient layer 35 may be about 10:1, more preferably 8:1, and preferably 5:1. In one example aspect, the first primary layer 32 may comprise or consist of $Al_2O_3$ with a thickness of 5-20 nm, the first gradient layer 33 may comprise or consist of a mixture of $Al_2O_3$ and ZnO having a thickness of 0.5 to 2 nm, the second primary layer 34 may comprise or consist of ZnO having a thickness of 1-15 nm, the second gradient layer 35 may comprise or consist of a mixture of $Al_2O_3$ and ZnO having a thickness of 0.5 to 2 nm, and the third primary layer 36 may comprise or consist of $Al_2O_3$ with a thickness of 5-20 nm. While three primary layers and two gradient layers are illustrated FIG. 2, the number of layers may be optimized depending on the object being coated. In one example aspect, the layers may continue to alternate between primary layers and gradient layers up to 50 total layers. The total thickness of the coating including all of the primary layers and gradient layers may be about 150 to 300 nm, more preferably about 200 to 250 nm.

In another aspect of the present invention, one or more (including all) of the layers 22, 24, 26, 32, 34, 36, may further include a dopant incorporated into the layer. The dopant may comprise or consist of any one of Ag, Au, Fe, Ir, Os, Pd, Pt, Rh, Ru, FeO, $HfO_2$, MgO, $SiO_2$, $SnO_2$, Ta, $Ta_2O_5$, TiN, $TiO_2$, $VO_2$, ZnO, and ZrO. For example, for a layer in which $Al_2O_3$ is the main component, ZnO may be added as the dopant. As used herein, dopant as the standard meaning in the art, i.e., a trace element that is inserted into a substance in very low concentrations. For example, during the deposition process to form the first layer (e.g., $Al_2O_3$), one pulse of the dopant material (e.g., ZnO) may be included for every 2 to 100 pulses of first layer material, more preferably one pulse dopant material for every 10 to 80 pulses of first layer material, and more preferably one pulse dopant material for every 30 to 60 pulses of first layer material. The same relative amount of dopant may be present in any (or all) of the other layers.

The method of coating the object will now be described. As noted above, the various layers of the coating may be applied to the object through atomic layer deposition (ALD). As known in the art, ALD is a thin film deposition technique that is based on the sequential use of a gas phase chemical process. The ALD process uses precursor chemicals that react with the surface of the object being coated. Through the repeated exposure to the precursors, a thin film is slowly deposited. During the ALD process, the precursors are inserted as a series of sequential, non-overlapping pulses. Using ALD, it is possible to grow materials uniformly and with high precision on complex and large substrates. Any ALD system known in the art may be used to coat the object. For example, the TFS 500 Atomic Layer Deposition system manufactured by Beneq Oy may be used.

Prior to starting the deposition, the object may be cleaned. Cleaning materials may be selected depending on the particular object being coated. For example, a sterling silver object may be rinsed with one or more of trichloroethylene, acetone, methanol, isopropanol, and deionized water, or combinations thereof. The cleaned object may then be blow dried with an inert gas such as pure nitrogen gas. The cleaned object may then be placed the reaction chamber of the ALD system. The reactor may then be brought to predetermined pressure and temperature for a predetermined amount of time for the object to equilibrate. The reaction chamber may be brought to a temperature of about 25° C. to about 200° C. (for example, about 150° C.) and a pressure of about atmospheric pressure to 5 mbar (for example about 1 mbar), and the object may remain in the chamber under these conditions for about one hour prior to the first deposition.

The ALD system my by pre-configured with the proper precursors to produce the layers that are desired. Suitable precursors for the various layer materials noted above are known in the art. For example, to deposit $Al_2O_3$ the precursor may be trimethylaluminum, to deposit ZnO the precursor may be diethyl zinc, to deposit $TiO_2$ the precursor may be tetrakis-dimethyl-amido titanium, and to deposit $SiO_2$ the precursor may be 3-aminopropyltriethoxysilane. Other $Al_2O_3$ precursors include aluminum tris(2,2,6,6-tetramethyl-3,5-heptanedionate), triisobutylaluminum, and tris(dimethylamido)aluminum(III). Other $TiO_2$ precursors include tetrakis(diethylamido)titanium(IV), tetrakis(ethylmethylamido)titanium(IV), and titanium(IV) diisopropoxidebis(2,2,6,6-tetramethyl-3,5-heptanedionate). Other precursors for ZnO include diphenylzinc, bis(2,2,6,6-tetramethyl-3,5-heptanedionato)zinc(II), and bis(pentafluorophenyl)zinc. Other precursors for $SiO_2$ include (N,N-dimethylamino)trimethylsilane $(CH_3)_3SiN(CH_3)_2$, vinyltrimethoxysilane $CH_2=CHSi(OCH_3)_3$, trivinylmethoxysilane $(CH_2=CH)_3SiOCH_3$, tetrakis(dimethylamino)silane $Si(N(CH_3)_2)_4$, tris(dimethylamino)silane (TDMAS) $SiH(N(CH_3)_2)_3$, tetraethoxysilane (TEOS), and $SiCl_4$. The ALD system would thus be supplied with whichever precursors are necessary to produce the desired material layer. Other standard precursors required for the ALD process such as water and oxygen are known in the art.

As noted above, in operation, the ALD system will pulse deliver the precursor that corresponds to the layer being formed. Each pulse provides particles that adsorb to the surface of the object. The thickness of particles adsorbed to the surface for each pulse is very thin, for example on the order of about 0.5 to 2 angstroms, depending on the precursor. For example, each pulse of trimethylaluminum may result in 0.9 angstroms thickness of $Al_2O_3$, each pulse of diethyl zinc may result in 1.9 angstroms thickness of ZnO, and each pulse of tetrakis-dimethyl-amido titanium may result in 0.5 angstroms of $TiO_2$. Between each pulse, the reaction chamber may be purged with inert gas (e.g., pure nitrogen) to remove excess (i.e., non-adsorbed) materials or byproducts. The pulsing of each material followed by purging may be repeated until the overall layer has reached the desired thickness. For example, if one angstrom of particles is deposited for each pulse of a particular precursor, and it is desired that the layer be 20 nm, then 200 cycles of pulses and purges will be performed. Once the desired thickness has been reached, the operation may switch to pulsing the next precursor until that layer is complete. The process may be repeated for all of the desired layers. Using this method, the final coating can be particularly tailored to have any number of layers of varying material and varying thicknesses.

For example, when preparing the coating shown in FIG. 1 having three layers, the method may include first pulsing and purging the appropriate precursor as many times as necessary to achieve the desired thickness of the first layer 22. Then, the method may switch to forming the second layer 24 by pulsing and purging the appropriate precursor as many times as necessary to achieve the desired thickness of the second layer 24. Finally, the method may proceed to forming the third layer 26 by pulsing and purging the appropriate precursor as many times as necessary to achieve the desired thickness of the third layer 26. For example, if is desired that the first layer 22 is 15 nm of $Al_2O_3$ and each pulse of trimethylaluminum results in one angstrom thickness of $Al_2O_3$, then the trimethylaluminum will be pulsed and purged 150 times. If it is desired that the second layer 24 is 10 nm of ZnO and each pulse of diethyl zinc results in two angstroms thickness of ZnO, then the diethyl zinc will be pulsed and purged 50 times. If it is desired that the third layer 26 is 10 nm of $Al_2O_3$, then the trimethylaluminum will be pulsed and purged 100 times.

Preparing the coating shown in FIG. 2 is similar to producing the coating of FIG. 1, except producing the gradient layer would comprise phasing in the second material before completely switching over to the second material. For example, the first primary layer 32 would be prepared in the same manner the first layer 22 is prepared as described above. That is, the precursor corresponding to the first primary layer 32 material would be pulsed and purged as many times as necessary to provide the desired thickness of the first layer material.

When preparing the gradient layer 33, because it is a mixture of the first layer material and the second layer material, with the first material gradually phasing to the second layer material, the pulses will switch between pulsing the first layer precursor to the second layer precursor, while increasing the number of secondary layer precursor pulses and decreasing the number of first layer precursor pulses with each subsequent switch. For example, after the first primary layer 32 is complete, and the gradient layer 33 deposition begins, a single pulse of the gradient layer may be a pulse of the second layer precursor. This may then be followed by four pulses of the first layer precursor, followed by two pulses of the second layer precursor, followed by three pulses of the first layer precursor, followed by three pulses of the second layer precursor, followed by two pulses of the first layer precursor, followed by four pulses of the second layer precursor, followed by one pulse of the first layer precursor. As this example illustrates, with each switch between precursors, the number of first layer precursor pulses decreases (i.e., four to three to two to one) and the number of second layer precursor pulses increases (i.e., one to two to three to four). Thus, the content of the gradient layer 33 gradually increases in the amount of the second layer material farther from the first layer 32 and closer to the second layer 34. It should be understood that the purging step occurs after each pulse.

Once the gradient layer 33 is complete, the method may then proceed to forming the second primary layer 34 in the same manner as described above with respect to the second layer 24. The same gradient formation steps may be repeated for forming the gradient later 35, except that the number of pulses of the third layer precursor would gradually increase while the number of pulses of the second layer precursor would gradually decrease. The steps may be repeated to produce any number of layers/gradient layers and overall desired thickness for the coating. While the above example of forming the gradient layer 33 started with four pulses of first layer precursor material, more pulses or fewer pulses may be used as the starting point depending on the desired thickness of the gradient layer.

Forming the dopant into a layer may be achieved by introducing a single pulse of dopant precursor at certain period during the layer depositing. For example, if it is desired to include a dopant material in one of the first layers 22, 32, after several pulses of the first layer precursor, a single pulse of dopant precursor may be performed. Then, the process may return to pulsing the first layer precursor. The dopant precursor pulse may occur after every few pluses of first layer material depending on how much dopant material is desired in the layer. For example, if it takes 100 pulses of first layer precursor to achieve the desired thickness of the first layer, a single pulse of dopant precursor may be performed after every 5, 10, 20, 30, etc. pulses of first layer precursor. For example, during the deposition process to form the first layer (e.g., $Al_2O_3$), one pulse of the dopant material (e.g., ZnO) may be included for every 2 to 100 pulses of first layer material, more preferably one pulse dopant material for every 10 to 80 pulses of first layer material, and more preferably one pulse dopant material for every 30 to 60 pulses of first layer material. The same relative amount of dopant may be present in any (or all) of the other layers. As noted above, the dopant may comprise or consist of any one of Ag, Au, Fe, Ir, Os, Pd, Pt, Rh, Ru, FeO, $HfO_2$, MgO, $SiO_2$, $SnO_2$, Ta, $Ta_2O_5$, TiN, $TiO_2$, $VO_2$, ZnO, and ZrO. Suitable precursors for depositing these materials are known in the art.

EXAMPLES

Tarnish Protection

Example 1

Figure 3:
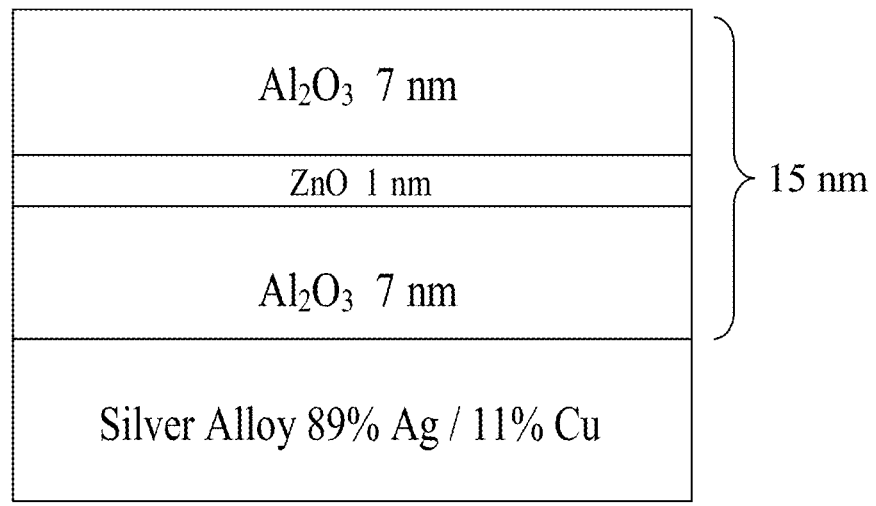
FIG. 3 illustrates an example of a coated object with a three-layer coating in accordance with aspects of the present invention.

A silver alloy of 89% by weight silver and 11% by weight copper was deposited on a silicon (Si) wafer. The Ag—Cu film was deposited onto the silicon wafer using thermal evaporation in a CHA Mark 40™ system. Approximately 100 nm of the 89% Ag-11% Cu alloy was deposited on the silicon wafer using a mixture of Cu (99.9%) and Ag (99.9%) at 2 angstroms/second deposition rate. This composition is comparable to silver alloy in museum objects are typically 92.5% silver and 7.5% copper. A discrete three-layer coating was deposited onto the wafer using the ALD method described above. A Beneq TFS 500 Atomic Layer Deposition (ALD) system with a 200×170×5 mm sub-chamber was used to deposit the film. Before deposition, the wafer as cleaned by rinsing with (all reagent grade) trichloroethylene, acetone, methanol, isopropenol and deionized water, followed by blow drying with $N_2$ gas. The wafer as allowed to equilibrate in the 150° C. ALD chamber for 30 minutes before deposition began. The reaction chamber of the ALD system had pressure of 2 mbar and a temperature of 150° C. during deposition. The first layer was deposited by pulsing trymethylalumina and water for until 7 nm thickness of $Al_2O2_3$ was formed (70 cycles). The second layer was deposited onto the first layer by pulsing Diethyl zinc for 10 cycles until 1 nm thickness of ZnO was formed (10 cycles). The third layer was deposited onto the second layer by pulsing trymethylalumina and water until 7 nm thickness of Al2O3 was formed (70 cycles). The total thickness of the coating was 15 nm. Example 1 is shown in FIG. 3.

Example 2

Figure 4:
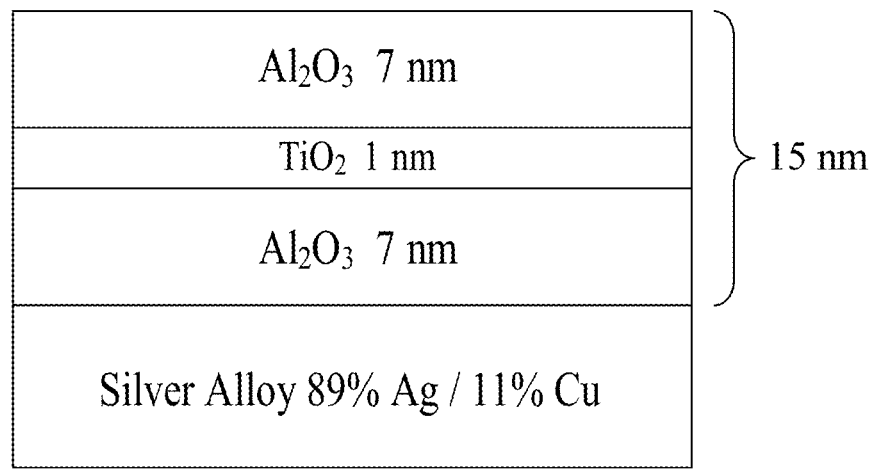
FIG. 4 illustrates an example of a coated object with a three-layer coating in accordance with aspects of the present invention.

A discrete three-layer coating was deposited onto the same silver alloy of Example 1 using the ALD method operating conditions as Example 1. The reaction chamber of the ALD system had the same pressure and temperature as Example 1. The first layer was deposited by pulsing trymethylalumina and water until 7 nm thickness of $Al_2O_3$ was formed (70 cycles). The second layer was deposited onto the first layer by pulsing tetrakis-dimethyl-amido titanium until 1 nm thickness of $TiO_2$ was formed (26 cycles). The third layer was deposited onto the second layer by pulsing trymethylalumina and water until 7 nm thickness of $Al_2O_3$ was formed (70 cycles). The total thickness of the coating was 15 nm. Example 2 is shown in FIG. 4.

Comparative Example 3

The same silver alloy of Example 1 was left bare, i.e., no coating was applied.

Comparative Example 4

The same silver alloy on silicon wafer as used in Example 1 was coated with solution of 1:1 nitrocellulose lacquer:thinner by brushing the solution onto the surface of the silver alloy wafer. A second coat was applied by rotating the sample 90° after the first had dried for 1 hour. An AlphaStep 200 Tencor TP-20 Profilometer was used to measure the thickness of the nitrocellulose film after a strip of the film was removed with acetone. The brushed nitrocellulose film was found to be 355 nm thick. Non-uniformity was observed where troughs were measured to be 290 to 370 nm deep.

Comparative Example 5

The same silver alloy on silicon wafer as used in Example 1 was coated with nitrocellulose by dipping the silver alloy wafer into a bath of a solution of 1:1 nitrocellulose lacquer:thinner. A second coat was applied by rotating the sample 90° after the first had dried for 1 hour. An AlphaStep 200 Tencor TP-20 Profilometer was used to measure the thickness of the nitrocellulose film after a strip of the film was removed with acetone. The coated nitrocellulose film was found to be 1.9 μm thick.

Comparative Example 6

A single-layer coating was deposited onto the same silver alloy on silicon wafer as used in Example 1 using the ALD operating conditions of Example 1. Trimethylaluminum and water were used as precursors to deposit $Al_2O_3$ at 150° C. with a deposition rate of 0.9 angstroms/cycle. The cycles were repeated until a single $Al_2O_3$ layer of 5 nm thickness was formed.

Comparative Example 7

A single-layer coating was deposited onto the same silver alloy on silicon wafer of Example 1 using the deposition method of Example 1. The cycles were repeated until a single $Al_2O_3$ layer of 10 nm thickness was formed.

Comparative Example 8

A single-layer coating was deposited onto the same silver alloy on silicon wafer of Example 1 using the deposition method of Example 1. The cycles were repeated until a single $Al_2O_3$ layer of 20 nm thickness was formed.

Examples 1-8 were subjected to age-accelerate testing. A custom aging chamber that controlled the temperature, $H_2S$ partial pressure and humidity level was built to age coated samples using modified designed from silver oxidation studies. A user interface using National Instruments LabVIEW™ controlled a set of mass flow controllers (MFCs) and sensors. Compressed Air (20-22% $O_2$, <2 ppm $H_2O$, <1 ppm CO and $CO_2$) and 20 ppm $H_2S$ (200,000 times ambient concentrations of 0.1 ppb) in air were introduced to the chamber to maintain a constant 20 ppm $H_2S$ concentration, as measured by an $H_2S$ sensor. An insulating box, built around the chamber, allowed the chamber to be heated to 40±1° C. without vapor condensation. Chamber humidity level was monitored and maintained at 15-18 $g/m^3$ (30-35% relative humidity) using MFC controlled air through a heated water bubbler. Inside the chamber, a manifold placed between the gas inlet and samples allow for even distribution of $H_2S$ gas mixture and humidified air. The samples were aged in the chamber for a cumulative time of 500 hours and were removed at intervals for reflection measurements. A HunterLab UltraScan PRO was used to determine reflectance from 300 to 1050 nm.

Figure 5A:
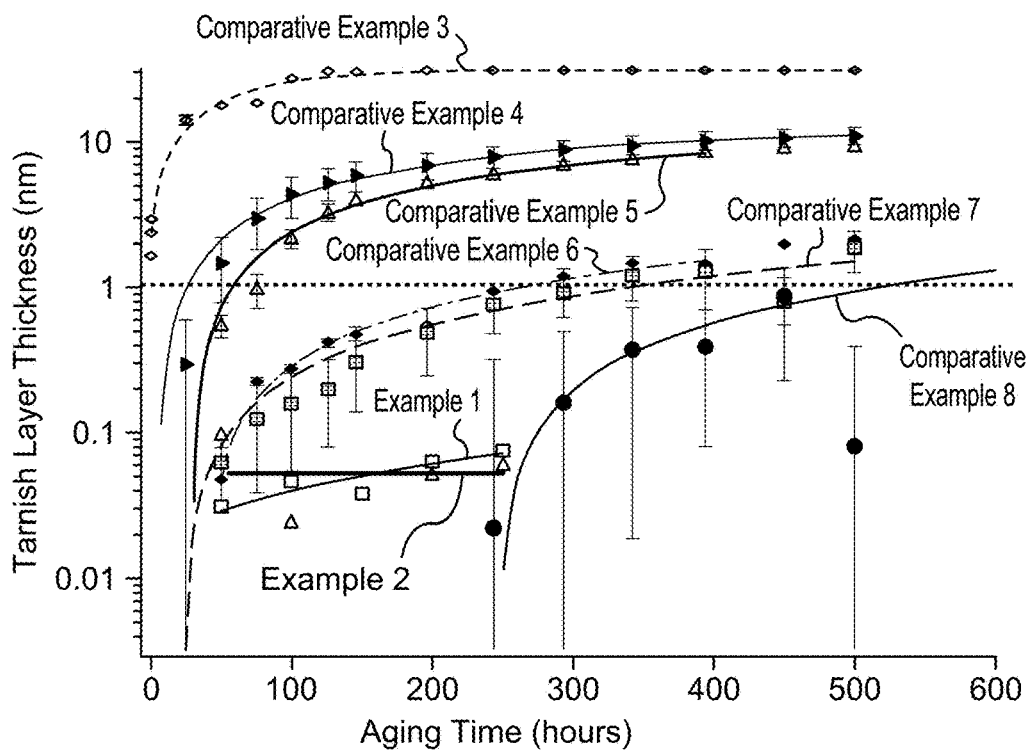
FIG. 5a illustrates a graph of aging time versus tarnish layer thickness for a variety of coatings on a sterling silver object.

As sulfur diffuses through the coating and reacts with the silver alloy surface, a dark $Ag_2S$ tarnish layer forms resulting in decreased reflectance. Tarnish layer thickness was estimated by comparing modeled $Ag_2S$ optical and dielectric properties with the measured relative reflectance change in the middle of the visible spectrum. The effective coating lifetime was defined as the time at which reflectance is reduced by 5%, corresponding to 1 nm tarnish layer accumulation at the metal surface. Effective lifetimes under accelerated aging conditions, $T_{20\ ppm\ H2S}$ (hours), and effective lifetime under ambient conditions, $T_{ambient}\ H_2S$ (years), is summarized in Table 1 below. FIG. 5a shows a graph of the accelerated aging results under elevated $H_2S$ concentrations. Nitrocellulose typically protects silver in museum environments for 10 years before requiring surface reconditioning and recoating. Thus, the lifetime of nitrocellulose brushed is defined as 10 years under ambient $H_2S$ concentration. This value was used to project the effective lifetimes under accelerated aging conditions to effective lifetimes under ambient conditions that appear in Table 1.

TABLE 1

| Coating | $T_{20\ ppm\ H2S}$ (hours) | $T_{ambient\ H2S}$ (years) (projected) |
|---|---|---|
| Comparative Example 4 | 35 | 10 |
| Comparative Example 5 | 57 | 16 |

TABLE 1-continued

| Coating | $T_{20\ ppm\ H2S}$ (hours) | $T_{ambient\ H2S}$ (years) (projected) |
|---|---|---|
| Comparative Example 6 | 270 | 75 |
| Comparative Example 7 | 350 | 98 |
| Comparative Example 8 | 517 | 148 |
| Example 1 | 4116 | 1176 |
| Example 2 | 4518 | 1290 |

As shown in FIG. 5a and Table 1, the effective lifetime of brushed on nitrocellulose and dipped nitrocellulose coatings is 35, and 57 hours, respectively, while single-layer ALD coatings of 5 nm, 10 nm, and 20 nm have effective lifetimes of 75, 98, and 148 hours, respectively. However, the tarnishing rate of the tri-layer ALD coatings are much slower than the single layer coatings and have projected effective lifetime of about 1200 to 1300 hours. From the aging times, ALD coatings offer superior barrier protection compared with nitrocellulose coatings. As shown in Table 1, the effective projected lifetimes of 5, 10, and 20 nm single layer ALD are 75, 98, and 148 years, respectively, a large improvement over nitrocellulose coatings. For single layer ALD coatings, the effectiveness is dependent on the coating thickness. Thicker coatings protect longer as $H_2S$ has to travel further to reach the metal surface. As shown in Table 1, ALD coating effectiveness is drastically improved by multilayers of metal oxides, as shown by the tri-layer ALD coatings, which have a projected lifetime of about 1200 to 1300 years. The total thickness of the tri-layer example coating is 15 nm, yet it protects over 100 times longer than single layer ALD coatings with similar thicknesses.

Figure 5B:
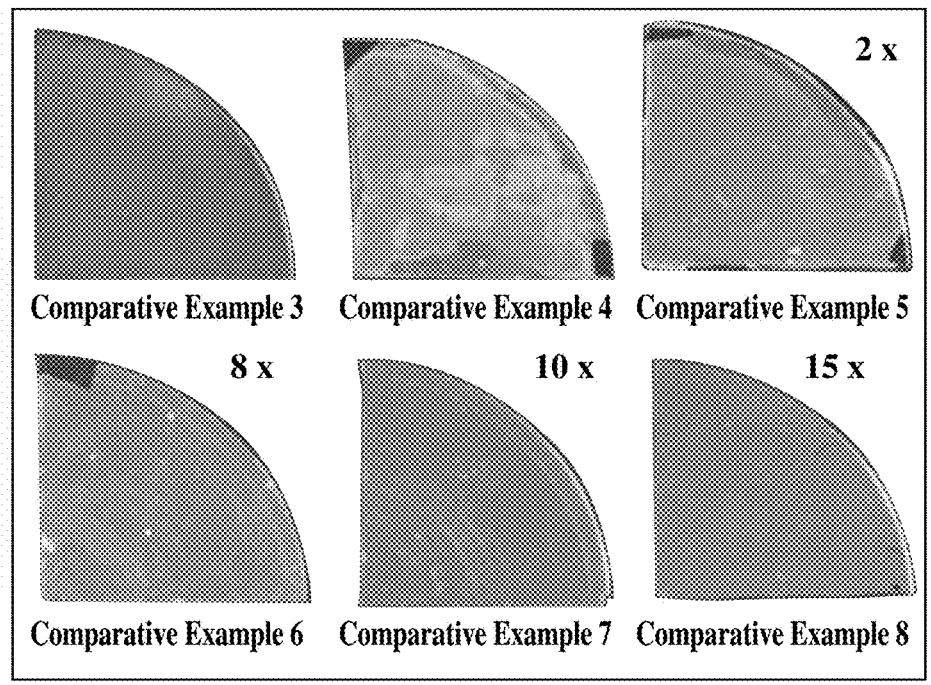
FIG. 5b shows photos of tarnished non-uniformly for a plurality of aged coating on a sterling silver object.

The results of the tarnish layer thickness determination, as a function of accelerated aging time are shown in FIG. 5a, for 89% Ag-11% Cu alloys, deposited on silicon wafers with no coating (bare), coated with nitrocellulose (brush and dip applied), and coated with 5 nm, 10 nm, and 20 nm thick ALD $Al_2O_3$ films. The bare silver alloy tarnishes rapidly, with an effective lifetime (time to form 1 nm $Ag_2S$) of less than an hour under these conditions. Nitrocellulose brushed and dipped coatings increased the lifetime to 35 and 57 hours, respectively, as marked by arrows in FIG. 5a. Nitrocellulose coatings, approximately 1-2 μm thick, tarnished non-uniformly with heavy tarnishing in thinner areas, as shown in the photographs taken after 500 aging hours (FIG. 5b). Even very thin ALD $Al_2O_3$ coatings increase this lifetime dramatically, with 5 nm, 10 nm and 20 nm $Al_2O_3$ ALD films lasting 270, 350, and 517 hours, respectively, under accelerated aging conditions. Photos of these samples show little sign of tarnishing (although there are some visible surface scratches caused by handling). The effective film lifetime for the 5 nm, 10 nm and 20 nm thick ALD $Al_2O_3$ films are 2, 8, 10 and 15 times longer than those for dipped nitrocellulose films.

Reversability $Al_2O_3$ ALD films can be etched off with a weak solution of NaOH. The amount of time required for each concentration of NaOH solution to completely remove the $Al_2O_3$ coating was determined by exposing bulk sterling silver after the NaOH etch to a 0.45 g/L potassium polysulfide and 0.15 g/L sodium carbonate solution (Photographers Formulary Polysulfide Toner™), which rapidly tarnished bare silver but did not tarnish silver coated with 2 nm of $Al_2O_3$ after a fixed time (10 seconds). The removal rates for each NaOH concentration were determined by incrementally submerging an $Al_2O_3$ coated bulk sterling silver strip into the NaOH solution for a given amount of time followed by exposure to the polysulfide solution. $Al_2O_3$ ALD removal rates on sterling silver (92.5% Ag-7.5% Cu) substrate exposed to 0.05 wt %, 0.5 wt %, and 5% aqueous NaOH solutions were determined to be 0.02, 0.08 and 0.17 nm per second, respectively.

The post-etched surface was then characterized by x-ray photoelectron spectroscopy (XPS) performed on a Kratos AXIS 165 using the monochromatic Al Kα (1486.7 eV) x-ray source with a 125 mm Omnicron (EA 125) hemispherical analyzer with a seven-channel detection capability for photoemission analysis. Survey spectra were collected at a pass energy of 160 eV and high resolution spectra were collected at a pass energy 40 eV. Argon ion sputter profile data was collected at an argon pressure of about $8 \times 10^{-8}$ Torr and a current density of about 40 μA/cm², while rastering the beam over a 3 mm² area. All peaks were calibrated to the C1s peak centered at 284.6 eV. XPS surface concentrations were calculated using CasaXPS™ from the peak areas of O as, Ag 3d, Cu 2p and C 1s using manufacturer supplied relative sensitivity factors.

Figure 6:
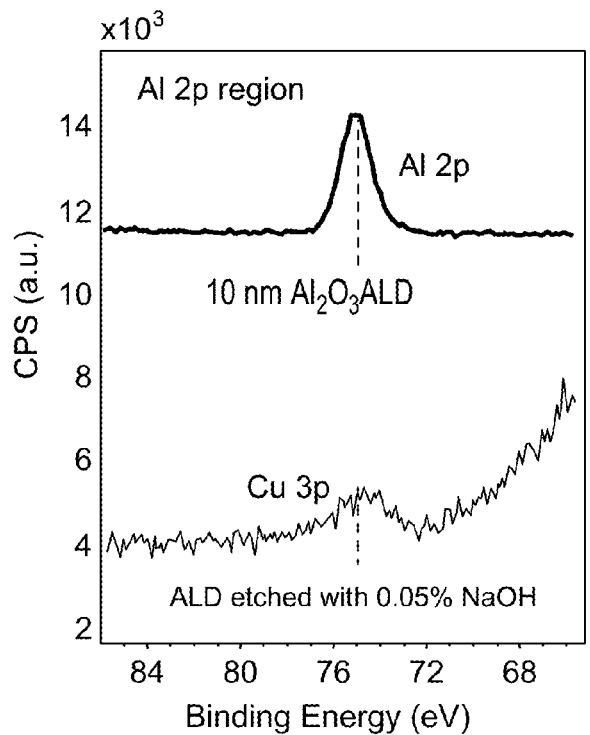
FIG. 6 illustrates a graph of a high resolution Al 2p x-ray photoelectron spectroscopy (XPS) scan of area before and after 0.05% NaOH etching of an $Al_2O_3$ coating.

The Al 2p peak was measured on 10 nm $Al_2O_3$ ALD film and an area exposed to 0.05% NaOH for 8 minutes. Complete removal of $Al_2O_3$ ALD is confirmed by the absence of the Al 2p after NaOH etching, making visible the small overlapping Cu 3p peak. FIG. 6 shows the $Al_2O_3$ ALD removal confirmed by high resolution Al 2p XPS scan of area before and after 0.05% NaOH etch.

To determine the effect of the NaOH etching on the sterling silver substrate, inductively coupled plasma mass spectrometry (ICP-MS) was used to analyze trace element concentrations in the etch solutions. Bulk sterling silver samples were coated with 70 nm of $Al_2O_3$. The backside of the silver was masked with chemical resistant, DuPont™ Kapton® tape prior to $Al_2O_3$ deposition to ensure that only the top and sides of the silver samples contributed to the concentration of metals in the NaOH etch solutions. ALD coated and uncoated bulk sterling silver samples were exposed to 4 mL of 0.05%, 0.5%, 5% NaOH etches for 53 minutes 45 seconds, 15 minutes 30 seconds, and 6 minutes 45 seconds, respectively. After removing the silver samples, the solution that remained were evaporated to dryness.

The amount of Ag and Cu removed by chemical removal by NaOH etching was compared with mechanical polishing with precipitated chalk and alumina grit (materials used in silver art conservation). Mechanical removal was performed via hand polishing with 0.04 μm precipitated chalk (Conservation Support Systems, Grade USP/NF) and Buehler Micropolish Linde B 0.05 μm gamma alumina polishing powders as ethanol slurries. Bulk sterling silver coupons were coated with 80 nm of $Al_2O_3$. The polishing removal time for each powder was determined by the polysulfide test described above. The coating was removed by polishing for 15 minutes using a cotton-tipped wooden stick ("Q-tip") and either 0.04 μm precipitated chalk or 0.05 μm alumina polishing powder in ethanol. Uncoated bulk sterling silver coupons were polished for 2 minutes using the same procedure. Control samples were made of the cotton swabs and polishing powders. All polishing materials, including used polish and cotton swab tip, were collected for ICP-MS analysis. Blank samples were prepared using equal amounts of polish, cotton swab tip, and ethanol.

The comparison between chemical and mechanical was made using inductively coupled plasma mass spectroscopy (ICP-MS). Samples were dissolved completely in concentrated nitric acid (70% BDH® Aristar Ultra grade) followed by dilution with MilliQ (18.2M Ohm) water to 50 mL. Solutions were analyzed using a Thermo Finnigan Element 2 ICP-MS. Solutions were introduced to the ICP-MS using a self-aspirating PTFE nebulizer at a rate of 50 μL min$^{-1}$ and sprayed into an ESI Apex IR desolvator. Mass spectrometer tuning to minimize oxide production led to a UO production rate between 1% and 2%. Isotopes for analysis were selected to avoid potential isobaric interferences (both elemental and molecular). Sample windows were set to 100% with ten mass stations defining the peak. Each station was counted for 5 msec and the entire mass list counted 20 times, giving a total analytical time for each sample of 30 seconds. Washout time between samples was 4 minutes. Standard solution addition and analysis was used to calculate concentrations.

Figure 7:
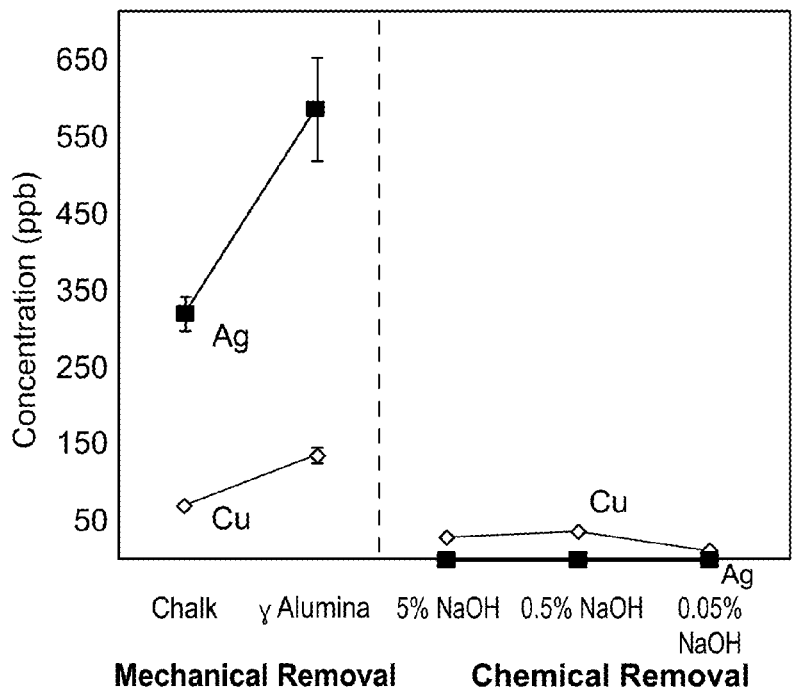
FIG. 7 illustrates a graph of an amount of Ag and Cu removed from sterling silver substrates by mechanical (polishing) and chemical (NaOH etch) removal.

Chemical removal was found to remove about 10 times less Cu than mechanical polishing with γ-alumina. This is shown in FIG. 7, which shows the amount of Ag and Cu removed from sterling silver substrates by mechanical (polishing) and chemical (NaOH etch) removal. While chemical removal selectively etches Cu from the sterling silver, low 0.05 wt % NaOH concentrations remove 10 times less Cu than mechanical polishing. Chemical removal selectively etched Cu from the sterling silver, while decreasing NaOH concentration decreases this effect. The amount of Cu removed was 0.02 ppm for 0.05 wt % NaOH and 70 ppm for precipitated chalk polish, indicating the lowest concentration of NaOH tested removed significantly less Cu than mechanical polishing.

Figure 8:
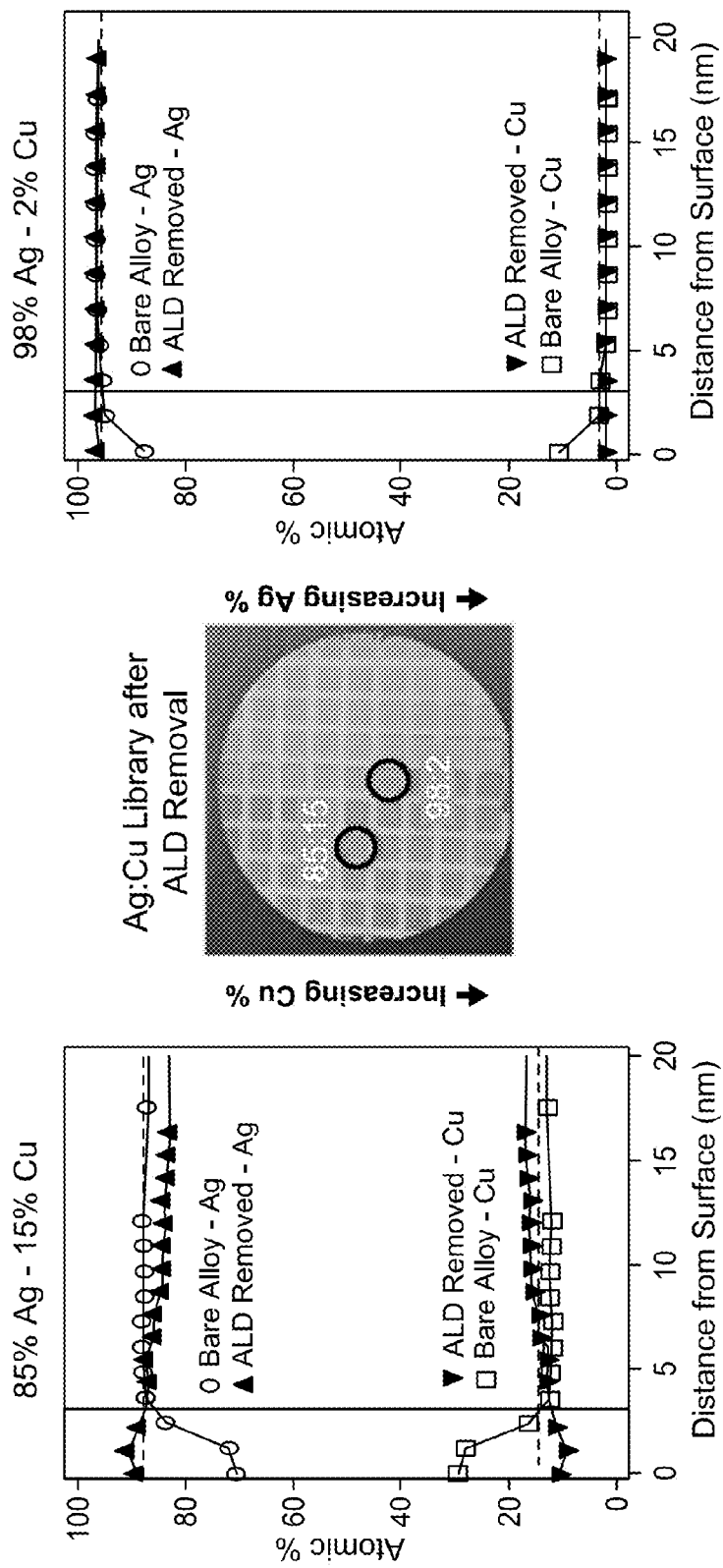
FIG. 8 illustrates XPS depth profiles to determine depth of Cu removal in Ag—Cu combinatorial sputter deposited libraries of various Ag—Cu alloy compositions.

Finally, the depth of selective Cu removal from combinatorial silver-copper alloy substrates, where the alloy composition varied over a large range was tested. Combinatorial Ag—Cu libraries were created on 2" Si wafers with a 10 nm $Al_2O_3$ ALD adhesion layer and a Si wafer masks with 4.2 mm² squares spaced 1 mm apart. Ag (99.99%) and Cu targets (99.995%) were both sputtered at 60 W (DC) and 60 W (RF), respectively in a Kurt J. Lesker Company PVD 75 thin film deposition system. Deposition was completed under a vacuum with basepressure $7-8 \times 10^{-6}$ torr and an Ar atmosphere of 5 mtorr at room temperature to produce films with thicknesses between 200-300 nm, varying in thickness across the wafer. Film thickness for individual squares was determined by an AlphaStep 200 Tencor TP-20 Profilometer after ALD deposition and removal. The film thickness at a given location was used to calibrate sputter time to thickness for the XPS depth profiles XPS depth profiling showed that pristine uncoated sample had a 2-3 nm thick Cu enriched region at the surface, (a characteristic intrinsic to these artificially produced alloys), before reaching a "bulk" composition of 15% Cu-89% Ag. FIG. 8 shows XPS depth profiles to determine depth of Cu removal in Ag—Cu combinatorial sputter deposited libraries of various Ag—Cu alloy compositions. Cu enriched surface area removed by 0.05 wt % NaOH etch but the depth affected is localized to the top 2-3 nm of the surface. After adjusting for sputtering artifacts, depth profiles after application of a 10 nm thick $Al_2O_3$ ALD layer, followed by removal in a 0.05% NaOH solution, showed no Cu enriched region present.

Transparancy

Example 9

Figure 9:
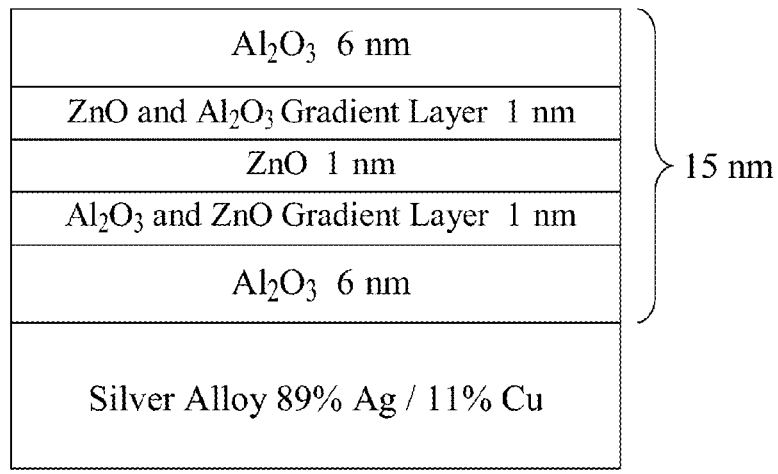
FIG. 9 illustrates an example coated object with a coating having gradient layers in accordance with aspects of the present invention.

A coating having three primary layers and two gradient layers was deposited onto the same silver alloy substrate as Example 1 using the gradient ALD method discussed above and using the operating conditions of Example 1 (i.e., 2 mbar and 150° C.). The first layer was deposited by pulsing trimethyl aluminum until 6 nm thickness of $Al_2O_3$ was formed (60 cycles). The first gradient layer was deposited onto the first layer by introducing a single pulse of diethylzinc followed by four pulses of trimethyl aluminum, followed by two pulses of diethylzinc, followed by three pulses of trimethyl aluminum, followed by three pulses of diethylzinc, followed by two pulses of trimethyl aluminum, followed by four pulses of diethylzinc, followed by one pulse of trimethyl aluminum. Each pulse was followed by a nitrogen gas purge. The completed first gradient layer was 1 nm thick of the combination of $Al_2O_3$ and ZnO. The second layer was deposited onto the first gradient layer by pulsing diethylzinc until 1 nm thickness of ZnO was formed (10 cycles). The second gradient layer was deposited onto the first layer by introducing a single pulse of trimethyl followed by four pulses of diethylzinc, followed by two pulses of trimethyl aluminum, followed by three pulses of diethylzinc, followed by three pulses of trimethyl aluminum, followed by two pulses of diethylzinc, followed by four pulses of trimethyl aluminum, followed by one pulse of diethylzinc. Each pulse was followed by a nitrogen gas purge. The completed second gradient layer was 1 nm thick of the combination of ZnO and $Al_2O_3$. The third layer was deposited onto the second gradient layer by pulsing trimethyl aluminum until 6 nm thickness of $Al_2O_3$ was formed (60 cycles). The total thickness of the coating was 15 nm. Example 9 is illustrated in FIG. 9.

Example 10

Figure 10:
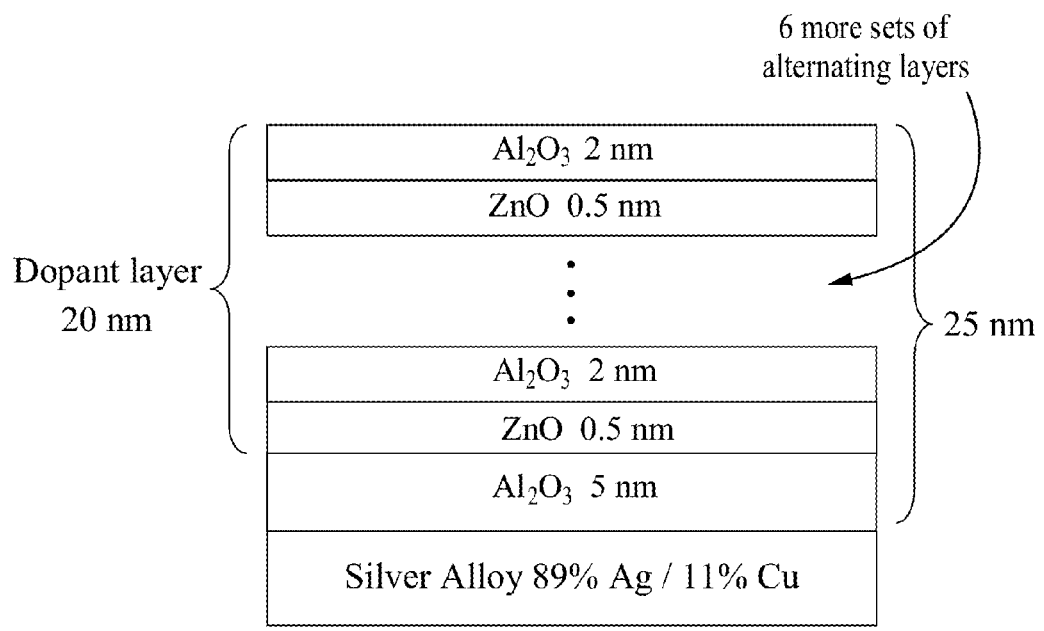
FIG. 10 illustrates an example coated object with a coating having dopants in accordance with aspects of the present invention.

A three-layer coating was deposited onto the same silver alloy substrate of Example 1, having dopants layers, using the operating parameters of Example 1. The first layer was deposited by pulsing trimethyl aluminum until 5 nm thickness of $Al_2O_3$ was formed (50 cycles). Next, a dopant layer is formed on the first layer. When forming the dopant layer, a dopant precursor of diethylzinc was pulsed 2 cycles (0.5 nm) after every 20 pulses (2 nm) of trimethyl aluminum. The 2 cycles of diethylzinc followed by 20 pulses of trimethyl aluminum was repeated 8 times until the dopant layer was 20 nm thick. The total thickness of the coating was 25 nm. Example 10 is illustrated in FIG. 10.

Comparative Example 11

A single-layer coating was deposited onto the same silver alloy on silicon wafer of Example 1 using the ALD method of Example 1. The first layer was deposited by pulsing trimethylaluminum until 80 nm thickness of $Al_2O_3$ was formed.

Comparative Example 12

A single-layer coating was deposited onto the same silver alloy on silicon wafer of Example 1 using the ALD method of Example 1. The first layer was deposited by pulsing trimethylaluminum until 130 nm thickness of $Al_2O_3$ was formed.

Comparative Example 13

Bare pure silver substrate (i.e., not an alloy).

Comparative Example 14

A single-layer coating was deposited onto the same silver alloy of Example 3 using the ALD method of Example 6. The single layer was deposited by pulsing trimethylaluminum until 100 nm thickness of $Al_2O_3$ was formed.

Comparative Example 15

A single-layer coating was deposited onto the same silver alloy of Example 3 using the ALD method of Example 6. The single layer was deposited by pulsing trimethylaluminum until 112 nm thickness of $Al_2O_3$ was formed.

Comparative Example 16

Ten periods of 7 nm of $Al_2O_3$/1 nm $TiO_2$ was deposited on the silver alloy. The $Al_2O_3$ was deposited by pulsing trimethylaluminum and the $TiO_2$ was deposited by plusing tetrakis-dimethylamido titanium. Ten periods means that 7 nm of $Al_2O_3$ wad deposited followed by 1 nm of $TiO_2$ and the 7/1 process was repeated 9 more times. The operating conditions were the same as in Example 1.

Example 17

A first layer of 48.8 nm of $Al_2O_3$ was deposited onto the silver alloy of Example 1 by the method of Example 1. A second layer of 45.3 nm $TiO_2$ was deposited on the first layer. The $Al_2O_3$ was deposited by pulsing trimethylaluminum and the $TiO_2$ was deposited by pulsing tetrakis-dimethylamido titanium.

Example 18

Figure 11:
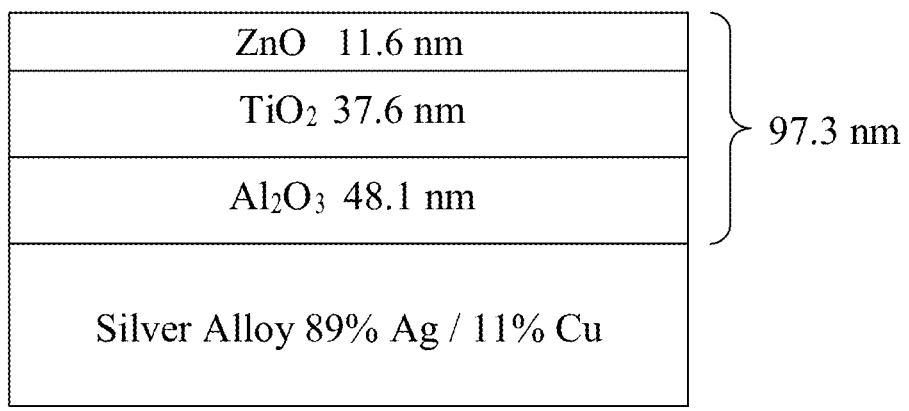
FIG. 11 illustrates an example coated object with a three-layer coating in accordance with aspects of the present invention.

A three-layer coating was deposited onto the silver alloy of Example 1 by the method of Example 1. The first layer of 48.1 nm of $Al_2O_3$ was deposited onto the silver alloy. A second layer of 37.6 nm $TiO_2$ was deposited on the first layer. A third layer of 11.6 nm ZnO was deposited on the second layer. The $Al_2O_3$ was deposited by pulsing trimethylaluminum the $TiO_2$ was deposited by plusing tetrakis-dimethylamido titanium, and the ZnO was deposited by pulsing diethylzinc. Example 18 is shown in FIG. 11.

Example 19

Figure 12:
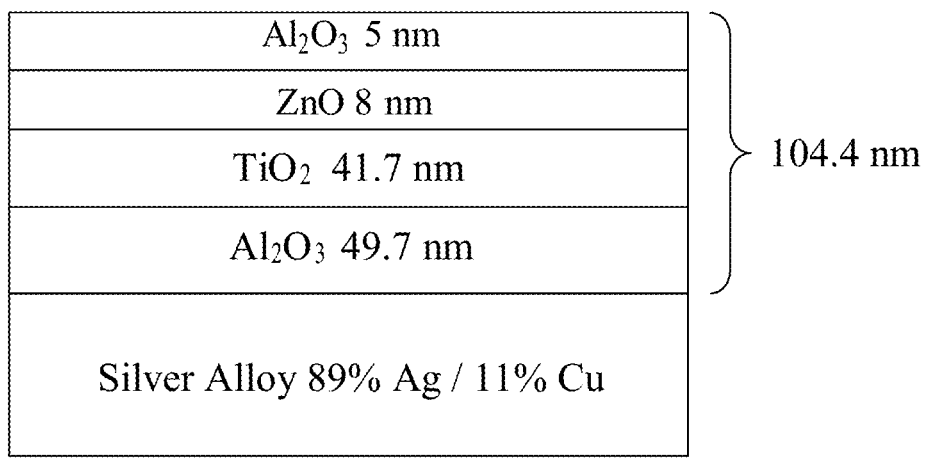
FIG. 12 illustrates an example coated object with a four-layer coating in accordance with aspects of the present invention.

A four-layer coating was deposited onto the silver alloy of Example 1 by the method of Example 1. The first layer of 49.7 nm $Al_2O_3$ was deposited on the silver alloy, the second layer of 41.7 nm $TiO_2$ was deposited on the first layer, the third layer of 8 nm ZnO was deposited on the second layer, and the fourth layer of 5 nm $Al_2O_3$ was deposited on the third layer. The precursor for $Al_2O_3$ was trimethyl-aluminum, the precursor for $TiO_2$ was tetrakis-dimethylamido titanium, and the precurose for ZnO was diethyl zinc. Example 19 is shown in FIG. 12.

Example 20

Figure 13:
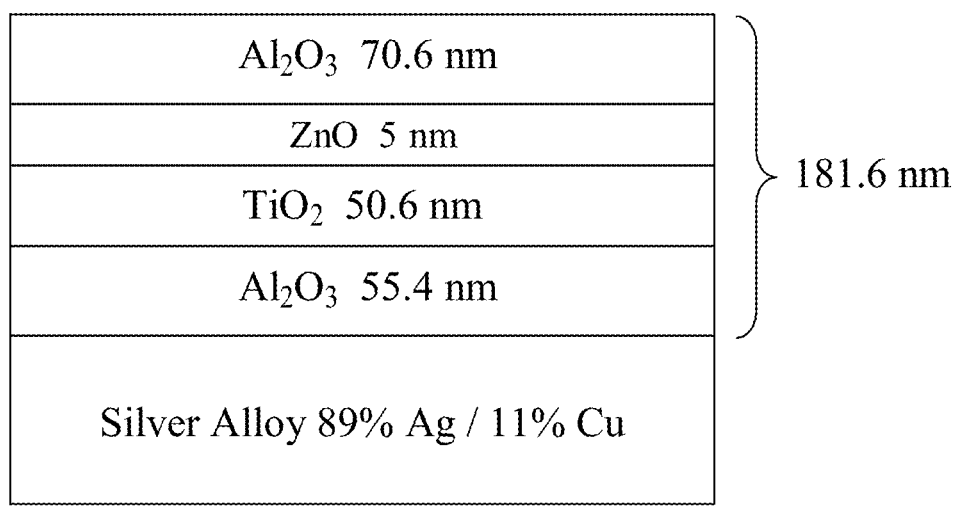
FIG. 13 illustrates an example coated object with a four-layer coating in accordance with aspects of the present invention.

A four-layer coating was deposited onto the silver alloy of Example 1 by the method of Example 1. A first layer of 55.4 nm $Al_2O_3$ was deposited on the silver alloy, a second layer of 50.6 nm $TiO_2$ was deposited on the first layer, a third layer of 5 nm ZnO was deposited on the second layer, and a fourth layer of 70.6 nm $Al_2O_3$ was deposited on the third layer. The precursor for $Al_2O_3$ was trimethyl-aluminum, the precursor for $TiO_2$ was tetrakis-dimethylamido titanium, and the precurose for ZnO was diethyl zinc. Example 20 is shown in FIG. 13.

Figure 14:
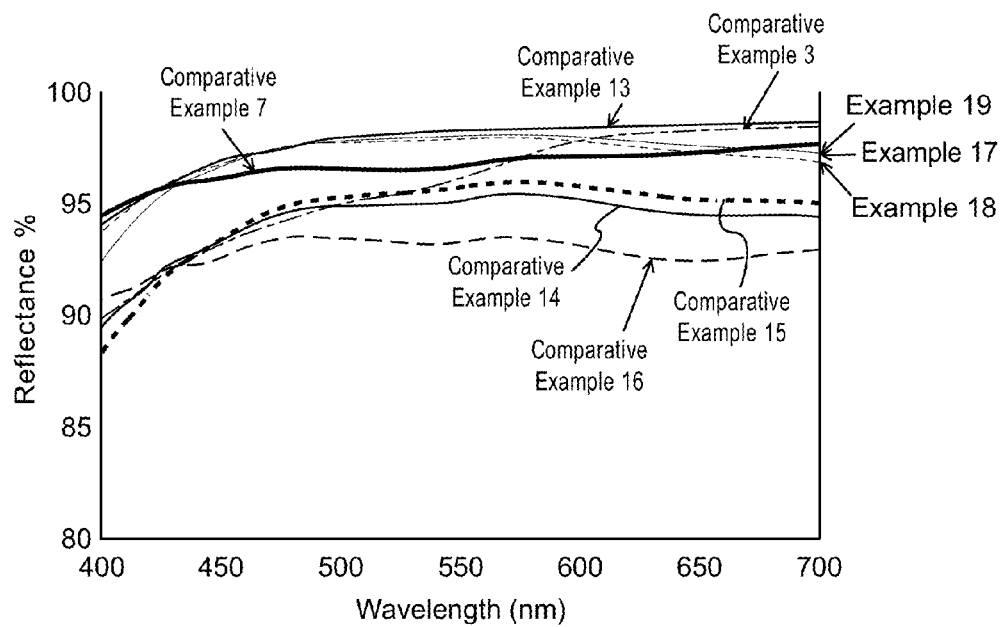
FIG. 14 illustrates a graph of modeled reflectance spectrum of bare metal substrates compared with coated metal substrates.

FIG. 14 shows modeled reflectance spectrum of bare metal substrates compared with ALD coated metal substrates. Multilayer films optimized to reduce color change on alloy substrates can be made by minimizing changes in the modeled reflectance spectrum for the ALD multilayer structure compared to the original substrate reflectance. The optical constants of ALD film materials and the bare substrate are used to solve the Fresnel equations for a given film structure, taking into account multiple interfaces and reflections, to generate the modeled reflectance spectrum. For an ALD film to be nearly invisible, changes in the reflectance spectrum need to be minimized. Varying the materials used, layer thickness and order of materials in the ALD film structure can minimize changes in the reflectance spectrum for a given substrate, thereby minimizing color change. FIG. 14 shows examples of color matching the ALD film structure for a given substrate to ensure minimal color changes. 10 nm $Al_2O_3$ (Example 7) or a 2 layer (Example 17), 3 layer (Example 18), or 4 layer (Example 19) ALD film match the reflectance spectrum for the bare silver substrates (Examples 3 and 13) within tolerance. A 10 period film of 7 nm $Al_2O_3$/1 nm $TiO_2$ (Example 16) produces a reflectance spectrum that does not match the bare substrate and would produce intolerable amounts of color change. FIG. 14 also illustrates reflectance spectrums for Examples 15 and 16.

Figure 15:
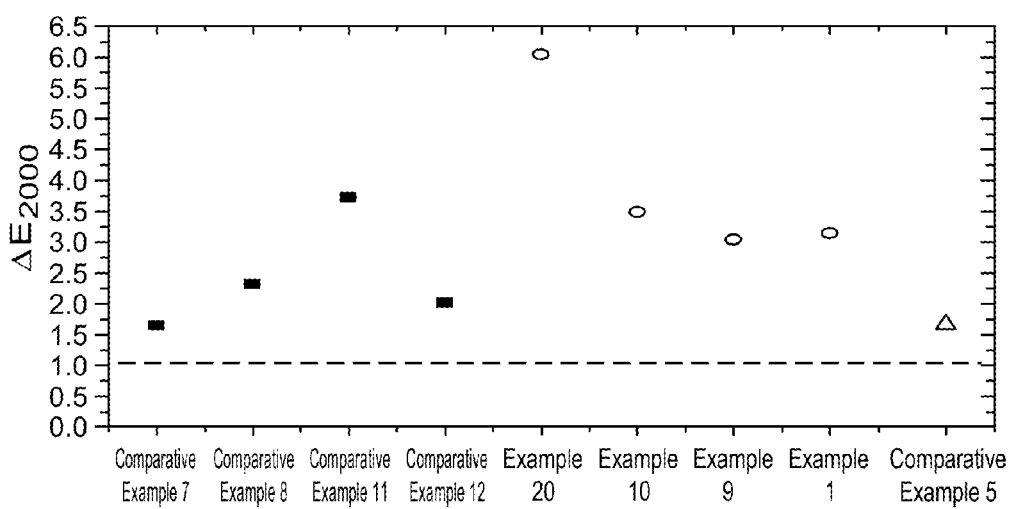
FIG. 15 illustrates a graph of Delta $E_{2000}$ values for a variety of coatings on silver sterling objects.

Examples 1, 5, and 7-12, and 20 were tested for optical properties, specifically, the change in reflectance spectrum of the coated substrate after coating as compared to pre-coating was measured. FIG. 15 shows the Delta $E_{2000}$ for Comparative Example 7, Comparative Example 8, Comparative Example 11, Comparative Example 12, Example 20, Example 10, Example 9, Example 1, and Comparative Example 5. Delta $E_{2000}$ refers to the International Commission on Illumination (CIE) color-difference formula, CIEDE2000. The values were determined using a Hunter-Lab UltraScan PRO with integrated sphere reflectance spectrometer to collect the reflectance as a function of wavelength and measure the L*a*b*c (space color values with respect to D65 illumination at 10 degree viewing angle and 0% UV filtration). Using these values, the color difference of the sterling silver before and after coating was quantified with the CIEDE2000 formula. The results are shown in FIG. 15.

A suitable multilayer coating that improves the optical properties of a specific metal alloy substrate may have a first layer of 1-10 nm $Al_2O_3$, a second layer of 25-75 nm $SiO_2$, a third layer of 1-10 nm $Al_2O_3$, a fourth layer of 25-75 nm $TiO_2$, a fifth layer of 5-35 nm $SiO_2$. Each layer may be deposited within the temperature range of 25-350 degrees Celsius. Precursors may include, tetrakis-dimethylamido titanium (TDMAT), trimethyl-aluminum (TMA), 3-aminopropyltriethoxysilane (APTES), water, and oxygen plasma.

Example 21

Figure 16:
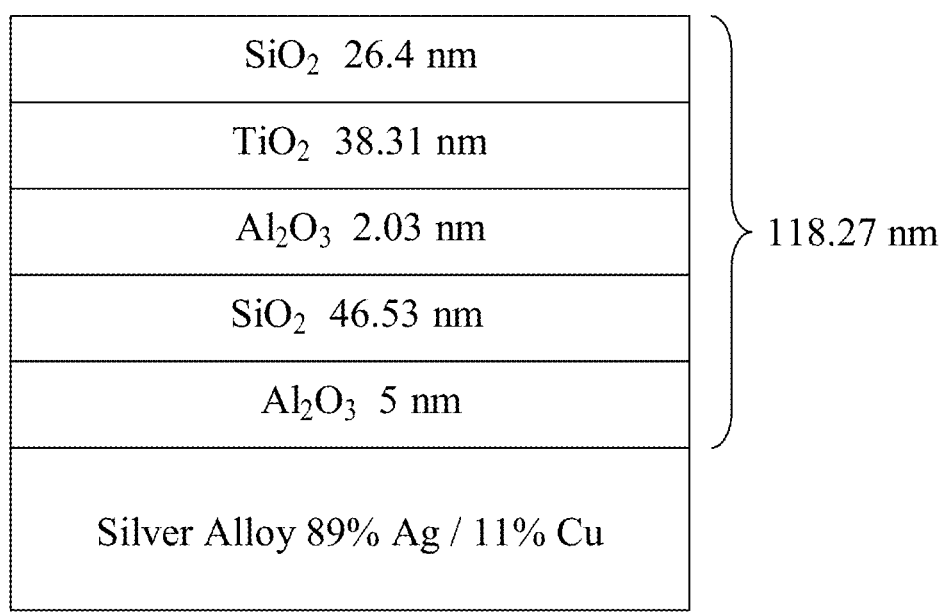
FIG. 16 illustrates an example coated object with a five-layer coating in accordance with aspects of the present invention.

An example of a suitable multilayer coating that improves the optical properties of a specific metal alloy substrate, e.g., a silver alloy of 89% by weight Ag and 11% by weight Cu has 5 nm $Al_2O_3$ first layer, a 46.53 nm $SiO_2$ second layer, a 2.03 nm $Al_2O_3$ third layer, a 38.31 nm $TiO_2$ fourth layer, and a 26.4 nm $SiO_2$ fifth layer. Each layer is deposited at under the same operating parameters are Example 1. The precursor for $TiO_2$ is tetrakis-dimethylamido titanium (TDMAT), the precursor for $Al_2O_3$ is trimethyl-aluminum (TMA), the precursor for $SiO_2$ is 3-aminopropyltriethoxysilane (APTES). Example 21 is shown in FIG. 16.

Comparative Example 22 the same as Comparative Example 7, except that the alloy is silver sterling having 92.5% by weight silver and 7.5% by weight copper.

Comparative Example 23 the same as Comparative Example 15, except that the alloy is silver sterling having 92.5% by weight silver and 7.5% by weight copper.

Example 24 the same as Example 18, except that the alloy is silver sterling having 92.5% by weight silver and 7.5% by weight copper.

Example 25 the same as Example 19, except that the alloy is silver sterling having 92.5% by weight silver and 7.5% by weight copper.

Comparative Example 26

A two-layer coating was deposited onto a silver alloy having 92.5% by weight silver and 7.5% by weight copper using the method of Example 1. A first layer of 45 nm of $Al_2O_3$ was deposited onto the silver alloy. A second layer of 45 nm $TiO_2$ was deposited on the first layer. The $Al_2O_3$ was deposited by pulsing trimethylaluminum and the $TiO_2$ was deposited by pulsing tetrakis-dimethylamido titanium.

Comparative Example 27

A single-layer coating was deposited onto the same silver alloy of Example 22 using the ALD method of Example 1. The single layer was deposited by pulsing trimethylaluminum until 70 nm thickness of $Al_2O_3$ was formed.

Comparative Example 28

A single-layer coating was deposited onto the same silver alloy of Example 22 using the ALD method of Example 1. The single layer was deposited by pulsing trimethylaluminum until 190 nm thickness of $Al_2O_3$ was formed.

Figure 17:
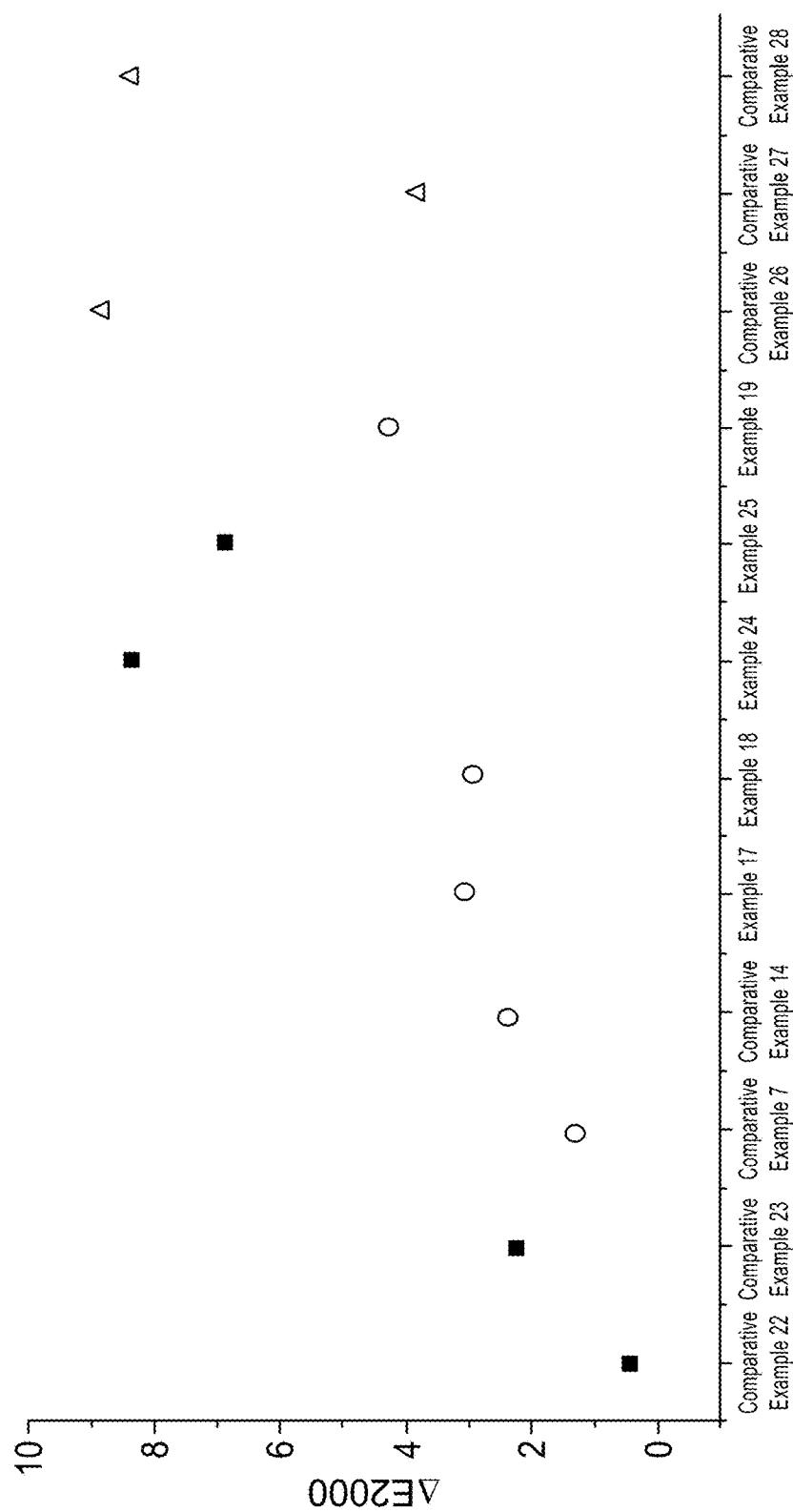
FIG. 17 illustrates a graph of a graph of Delta $E_{2000}$ values for a variety of coatings on two different sterling silver alloys.

Examples 7, 14, 17-19, 22-28 were tested for optical properties, specifically, the change in reflectance spectrum of the coated substrate after coating as compared to pre-coating was measured. FIG. 17 shows the Delta $E_{2000}$ values, which were determined in the same manner as discussed above.

Exemplary variations of aspects of the present invention have now been described in accordance with the above advantages. It will be appreciated that these examples are merely illustrative of aspects of the present invention. Many variations and modifications will be apparent to those skilled in the art.

The invention claimed is:
1. A method of coating a metallic object with a nearly invisible protective coating, comprising:
  placing the metallic object in an atomic layer deposition (ALD) reactor;

depositing a first layer comprising a metal oxide or a nitride on a surface of the metallic object by ALD;

depositing a second layer comprising a metal oxide or a nitride on the first layer by ALD; and depositing a third layer comprising a metal oxide or a nitride on the second layer by ALD, thereby forming the nearly invisible protective coating on the metallic object, wherein the nearly invisible protective coating has a Delta $E_{2000}$ of 5 or less.

2. The method of claim 1, wherein depositing the first, second, and third layers each comprises repeatedly pulsing a precursor material and purging the reactor with an inert gas following each pulse.

3. The method of claim 2, wherein depositing the first layer comprises repeatedly pulsing the precursor and purging with the inert gas until the first layer is about 1 to 100 nm thick;

wherein depositing the second layer comprises repeatedly pulsing the precursor and purging with the inert gas until the second layer is about 1 to 100 nm thick; and wherein depositing the third layer comprises repeatedly pulsing the precursor and purging with the inert gas until the third layer is about 1 to 100 nm thick.

4. The method of claim 2, wherein precursor material corresponds to a deposited material selected from the group consisting of $Al_2O_3$, FeO, $HfO_2$, MgO, $SiO_2$, $SnO_2$, Ta, $Ta_2O_5$, TiN, $TiO_2$, $VO_2$, ZnO, and ZrO.

5. The method of claim 2, wherein the precursor material is selected from the group consisting of trimethylaluminum, diethyl zinc, tetrakis-dimethyl-amido titanium, and 3-aminopropyltriethoxysilane.

6. The method of claim 2, wherein depositing the first layer comprises repeatedly pulsing trimethylaluminum;

wherein depositing the second layer comprises repeatedly pulsing tetrakis-dimethyl-amido titanium or 3-aminopropyltriethoxysilane; and wherein depositing the third layer comprises repeatedly pulsing diethyl zinc or trimethylaluminum.

7. The method of claim 6, further comprising depositing a fourth layer on the third layer by ALD by repeatedly pulsing tetrakis-dimethyl-amido or trimethylaluminum.

8. The method of claim 6, wherein depositing the first layer comprises repeatedly pulsing the trimethylaluminum until the first layer is about 20 to 50 nm thick;

wherein depositing the second layer comprises repeatedly pulsing the tetrakis-dimethyl-amido titanium or 3-aminopropyltriethoxysilane until the second layer is about 20 to 50 nm thick; and wherein depositing the third layer comprises repeatedly pulsing the diethyl zinc or trimethylaluminum until the third layer is about 1 to 10 nm thick.

9. The method of claim 1, further comprising depositing a gradient layer on the first layer by ALD prior to depositing the second layer, wherein depositing the gradient layer comprising pulsing a precursor used to form the first layer and a precursor used to form the second layer.

10. The method of claim 1, wherein depositing at least one of the first, second, and third layers further comprise pulsing a precursor corresponding to a dopant selected from the group consisting of Ag, Au, Fe, Ir, Os, Pd, Pt, Rh, Ru, FeO, $HfO_2$, MgO, $SiO_2$, $SnO_2$, Ta, $Ta_2O_5$, TiN, $TiO_2$, $VO_2$, ZnO, and ZrO.

11. The method of claim 1, wherein the surface comprises sterling silver.

12. The method of claim 1, wherein the nearly invisible protective coating has a Delta $E_{2000}$ of 4 or less.

13. The method of claim 1, wherein the nearly invisible protective coating has a Delta $E_{2000}$ of 3 or less.

14. The method of claim 1, wherein the nearly invisible protective coating has a Delta $E_{2000}$ of 2 or less.

15. The method of claim 1, wherein the nearly invisible protective coating has a Delta $E_{2000}$ of 1.

16. The method of claim 1, wherein the first layer comprises $Al_2O_3$.

17. The method of claim 16, wherein the second layer comprises $TiO_2$.

18. The method of claim 16, wherein the third layer comprises ZnO.

* * * * *